US008225154B2

(12) United States Patent
Sanavage et al.

(10) Patent No.: US 8,225,154 B2
(45) Date of Patent: Jul. 17, 2012

(54) LOW POWER DESIGN USING A SCAN BYPASS MULTIPLEXER AS AN ISOLATION CELL

(75) Inventors: Rodney M. Sanavage, Shrewsbury, MA (US); Sandra Soohoo-Loeffel, Northborough, MA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 475 days.

(21) Appl. No.: 12/571,720

(22) Filed: Oct. 1, 2009

(65) Prior Publication Data

US 2011/0080208 A1 Apr. 7, 2011

(51) Int. Cl.
*G01R 31/28* (2006.01)
*G01R 31/26* (2006.01)
*G11C 29/00* (2006.01)
*H03K 19/00* (2006.01)

(52) U.S. Cl. ........ 714/726; 714/729; 714/724; 714/718; 714/742; 324/762.01; 326/16; 365/201

(58) Field of Classification Search .................. 714/726, 714/729, 724, 718, 742; 324/762.01; 326/16; 365/201
See application file for complete search history.

(56) References Cited

U.S. PATENT DOCUMENTS

| 6,327,683 | B1 * | 12/2001 | MacCormack | 714/726 |
|---|---|---|---|---|
| 6,412,098 | B1 * | 6/2002 | Jin | 716/136 |
| 6,944,806 | B2 * | 9/2005 | Flynn et al. | 714/718 |
| 7,053,675 | B2 * | 5/2006 | Slobodnik et al. | 327/99 |
| 7,561,855 | B2 * | 7/2009 | Hofmeister et al. | 455/88 |
| 7,779,381 | B2 * | 8/2010 | Chickermane et al. | 716/111 |
| 2006/0012392 | A1 * | 1/2006 | Rencher et al. | 326/16 |
| 2007/0016834 | A1 * | 1/2007 | Debnath et al. | 714/726 |
| 2010/0019774 | A1 * | 1/2010 | Wu et al. | 324/537 |
| 2010/0153759 | A1 * | 6/2010 | Singhal | 713/322 |
| 2010/0174956 | A1 * | 7/2010 | Kawasaki et al. | 714/726 |

* cited by examiner

*Primary Examiner* — John J Tabone, Jr.
(74) *Attorney, Agent, or Firm* — Tucker Ellis LLP

(57) ABSTRACT

In an example embodiment there is described herein an apparatus, comprising a device having an input and an output, a controllable selecting device having a first input coupled to input of the device and a second input coupled to the output of the device, and a selection control circuit having a test input for receiving a test signal and a power mode input for receiving a power mode signal. The selection control circuit is coupled to the controllable selecting device and operable to control which input the controllable selecting device selects. The selection control circuit is configured to select the first input to isolate the device responsive to the test signal indicating no testing is being performed the power mode signal indicating a low power mode.

20 Claims, 4 Drawing Sheets

LOW POWER DESIGN USING A SCAN BYPASS MULTIPLEXER AS AN ISOLATION CELL

TECHNICAL FIELD

The present disclosure relates generally to circuits that provide isolation in a low power mode.

BACKGROUND

As the ASIC (Application Specific Integrated Circuit) industry moves forward with teach technology mode (for example from 90 nm to 65 nm to 45 nm), the necessity for Low Power Design techniques increases. One Low Power technique involves powering down unused portion of the design to save both dynamic and leakage power. When design parts are powered down, care must be taken between the powered down outputs and powered on inputs. An isolation cell may be used to prevent short circuit currents. The traditional isolation cell for single voltage designs (AND, OR gates) address this issue; however, the traditional isolation cell can complicate Design For Test (DFT) coverage issues and result in higher design area overhead.

BRIEF DESCRIPTION OF THE DRAWINGS

The accompanying drawings incorporated herein and forming a part of the specification illustrate the examples embodiments.

OVERVIEW OF EXAMPLE EMBODIMENTS

Figure 1:
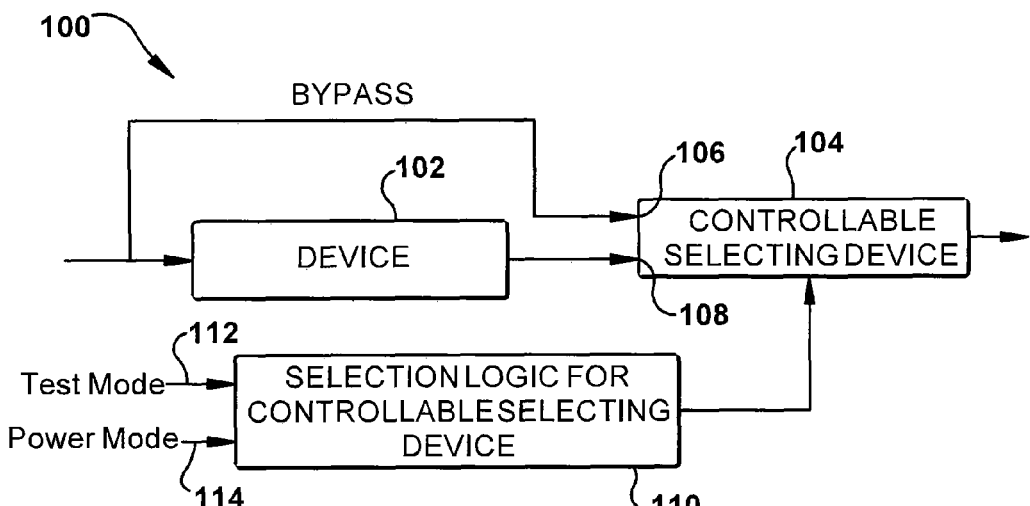
FIG. 1 illustrates an example of a circuit for implementing low power isolation in accordance with an example embodiment.

The following presents a simplified overview of the example embodiments in order to provide a basic understanding of some aspects of the example embodiments. This overview is not an extensive overview of the example embodiments. It is intended to neither identify key or critical elements of the example embodiments nor delineate the scope of the appended claims. Its sole purpose is to present some concepts of the example embodiments in a simplified form as a prelude to the more detailed description that is presented later.

In accordance with an example embodiment, there is disclosed herein an apparatus comprising a device having an input and an output, a controllable selecting device having a first input coupled to input of the device and a second input coupled to the output of the device, and a selection control circuit having a test input for receiving a test signal having a first level for indicating testing is being performed and a second level for indicating testing is not being performed, and a power mode input for receiving a power mode signal having a first level indicating normal power mode and a second level for indicating a lower power mode. The selection control circuit is coupled to the controllable selecting device and operable to control which input the controllable selecting device selects. The selection control circuit is configured to select the first input to isolate the device responsive to the test signal being at the second level and the power mode signal being at the second level.

In accordance with an example embodiment, there is disclosed herein an apparatus comprising a device having an input and an output, a multiplexer having a first input coupled to input of the device and a second input coupled to the output of the device, and means for selecting one of the first input of the multiplexer and the second input of the multiplexer. The means for selecting having first input for receiving a scan mode signal having a first level indicating a scan mode is active and a second level indicating the scan mode is inactive, a second input for receiving a built in self test signal having a first level indicating built in self test mode and a second level indicating the built in self test mode is inactive, and a third input for receiving a power mode signal having a first level indicating normal power mode and a second level for indicating a lower power mode. The means for selecting is coupled to the multiplexer and operable to control which input the controllable selecting device selects. The means for selecting is configured to select the first input to isolate the device responsive to the scan mode signal being at the second level, the built in self test signal being at the second level and the power mode signal being at the second level.

In accordance with an example embodiment, there is disclosed herein a method for isolating an output of a device also having an input, where the input of the device is coupled to a first input of a multiplexer and the output of the device is coupled to a second input of the multiplexer. The method comprises receiving a power mode signal, where a first level of the power mode signal indicates a normal operating mode and a second level indicates a low power level. A built in self test mode signal is received, where a first level of the built in self test mode signal indicating a self test mode is active and a second level indicating the built in self test mode is inactive. A scan mode signal is received, where a first level indicates a scan mode is active and a second level indicates the scan mode is inactive. The method further comprises determining whether the power mode signal is at the first or second level, determining whether the built in self test mode signal is at the first or second level, and determining whether the scan mode signal is at the first or second level. The first input is selected to isolate the output of the device responsive to determining the power mode signal is at the second level, the built in self test mode signal is at the second level and the scan mode signal is at the second level.

Description of Example Embodiments

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

In accordance with an example embodiment, there is described herein an apparatus having a memory such as an embedded dynamic random access memory (eDRAM) and a multiplexer (MUX) having a first input coupled to the input of the eDRAM and a second input coupled to the Q outputs of the eDRAM. When testing in Scan Mode, the MUX selects the first input, and in Built In Self Test (BIST) mode the MUX selects the second input. Thus, the MUX is used to isolate the Q outputs instead of AND or OR gates. By using the MUX as an isolation cell in Low Power Mode, the need for an additional gate at every powered off output is eliminated. This eliminates the area penalties incurred if the AND and/or OR gates are employed as isolation cells after the MUX and increases the DFT coverage.

FIG. 1 illustrates an example of a circuit 100 for implementing low power isolation in accordance with an example embodiment. Apparatus 100 comprises a device 102 having an input and an output, a controllable selecting device 104 having a first input 106 coupled to input of device 102 and a second input 108 coupled to the output of device 102. A selection control circuit 110 having a test input 112 for receiving a test signal having a first level for indicating testing is being performed and a second level for indicating testing is not being performed, and a power mode input 114 for receiving a power mode signal having a first level indicating normal power mode and a second level for indicating a lower power mode, is coupled to controllable selecting device 104 and operable to control which input controllable selecting device 104 selects. Selection control circuit 110 suitably comprises logic for selecting which input controllable selecting device 104 selects. As used herein, "logic" includes but is not limited to hardware, firmware, software that when executing on a processor and/or combinations of each to perform a function (s) or an action(s), and/or to cause a function or action from another component. For example, logic may be implemented by combinational logic.

In an example embodiment, in normal operating mode, controllable selecting device 104 selects second input 108 which is coupled to the output of device 102. When controllable selecting device 104 selects first input 106, the input of device 102 is selected and the device is bypassed. In testing the device, this may be referred to the scan mode. The output of device 102 is isolated while the switching device is selecting first input 106.

In an example embodiment, selection control circuit 104 is configured to select first input 106 to isolate the output of device 102 responsive to the test signal received at input 112 being at the second level and the power mode signal received at input 114 being at the second level.

In an example embodiment (see for example FIG. 2 which will be described in further detail herein infra), the device further comprises additional outputs such as direct test outputs, fuse interface outputs that also require isolation. These additional outputs may be coupled to another gate, such as an AND gate for isolation. In particular embodiments, selection control logic 214 suitably comprises additional logic for determining when the AND gates should be employed for isolating these additional outputs. For example, a high signal may be asserted to the AND gate, thus the output of the AND gate would be equivalent to the signal from the additional output. A low signal may be asserted to the AND gate to isolate the signal from the additional output. Although the examples described herein discuss AND gates, those skilled in the art should readily appreciate that the functionality performed by the AND gates may be performed by other types of gates such as NAND, NOR, etc and thus the example embodiments described herein should not be construed as limited to only gates, but should be interpreted to encompass any gate, or combination of gates, which may mask off a signal.

In an example embodiment, the test signal received at input 112 may suitably comprise a plurality of signals. For example, the test signal may include a scan mode signal, the scan mode signal having a first level to indicate scan mode is active and a second level to indicate when the scan mode is inactive. The test signal may also include a built in self test mode signal having a first level to indicate built in self test mode is active and a second level to indicate built in self test mode is inactive. Selection control circuit 110 logic is configured to determine which input 106, 108 of controllable selecting device 104 to select based on the scan mode signal, built in self test mode signal and/or the power mode signal, or any combination thereof. Moreover, selection control logic 110 may prioritize one signal over another (for example if a first signal is set at a first setting it may base the decision on first and second signals whereas if the first signal is at a second signal the second signal is ignored).

For example, in an example embodiment, selection control circuit 110 is configured to select first input 106 of the controllable selecting device 104 responsive to the scan mode signal being at the first level. In an example embodiment, selection control circuit 110 is configured to select second input 108 of the controllable selecting device 104 responsive to the built in self test mode signal being at the first level. In particular embodiments, which employ an AND gate to isolate additional outputs, selection control circuit 110 can be configured to employ the AND to isolate the at least one other output responsive to the built in test mode signal being at the second level. In an example embodiment, selection control circuit 110 is configured to employ the AND gate to isolate the at least one other output responsive to the power mode signal being at the second level and the second test input built in test mode sign being at the second level.

In an example embodiment, controllable selecting device 104 is a multiplexer (MUX). Many types of multiplexers are suitable for implementing controllable selecting device 104. For example, as will be illustrated in FIG. 5, a multiplexer with AND gate inputs may be employed. The selection signal is input to an input of a first AND gate and the inverted selection signal is input to an input of a second AND gate. An input of the first AND gate can be coupled to the input of device 102 and an input of the second AND gate can be coupled to the output of device 102. The outputs of the AND gate may be coupled to an OR gate. As another example, see for example FIG. 6, an inverted multiplexer can be employed.

In an example embodiment, selection control circuit 110 comprises a first OR gate having first and second inputs and an output coupled to the select input of controllable selecting device (for example a MUX). The first of the OR gate is receives the scan mode signal and the second input of the OR gate receives the signal sent based on the power mode signal and the built in self test mode signal. In particular embodiments, selection control circuit 110 further comprises a second OR gate having first and second inputs and an output, the first input receiving the power mode signal inverted, the second input receiving the built in test signal, and the output coupled to the AND gate (coupled to the additional outputs, see e.g. FIG. 3) and to the second input of the first OR gate.

In an example embodiment, device 102 is a memory device such as a Dynamic Random Access Memory (DRAM) or an embedded DRAM (eDRAM) further comprising a plurality of memory outputs, each of the plurality of memory outputs is coupled to a controllable selecting device 104 (such as a multiplexer) having first and second inputs and a select input, wherein the first input is coupled to the input of the memory and the second input is coupled to a one of the plurality of memory outputs and the select input is coupled of the output of the first OR gate of selection control circuit 110. In particular embodiments, the memory device further comprises a plurality of other outputs (for example test outputs), where each of the plurality of other outputs is coupled to an AND gate having first and second inputs, wherein the first input is coupled a one of the plurality of other outputs of the memory device and the second input is coupled to the second OR gate of selection control circuit 110.

In an example embodiment, device 102 is a memory device that further comprises a plurality of memory devices, each having an input and a plurality of memory outputs, wherein each of the plurality of outputs are coupled to a controllable selecting device 104 (such as a multiplexer) having first and second inputs and a select input, wherein the first input of the controllable selecting device 104 is coupled to the input of the memory and the second input of the controllable selecting device 104 is coupled to one of the plurality of outputs of the memory device and the select input is coupled to the output of the first OR gate of selection control circuit 110.

Figure 2:
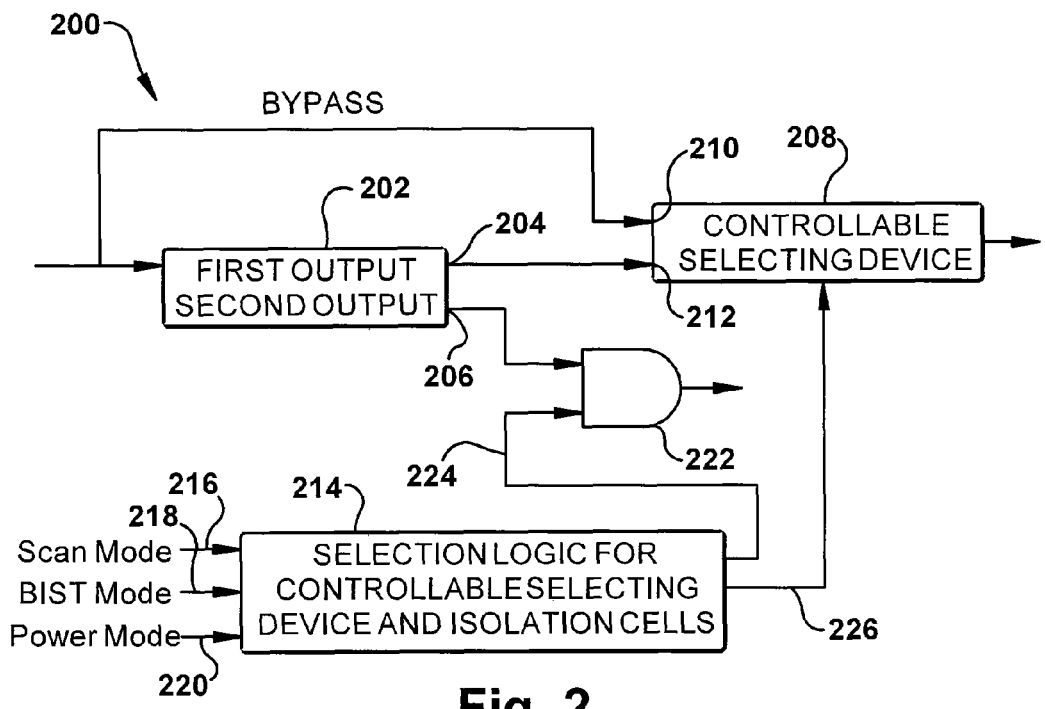
FIG. 2 illustrates an example of a circuit for implementing low power isolation for a device having memory a first output coupled and a second output.

FIG. 2 illustrates an example of a circuit 200 for implementing low power isolation for a device 202 having a first (for example memory) output 204 and a second (for example test) output 206. For example, device 202 may be a memory device such as a eDRAM having Q outputs (represented by first output 204) and addition outputs such as test outputs (represented by second output 206). Device 202 is coupled to controllable selecting device 208 that has a first input 210 (a bypass input) coupled to the input of device 202 and a second input 212 coupled to the first output 204 of device 202. Second output 206 of device 202 is coupled to AND gate 222.

Selection control circuit 214 receives a Scan mode signal 216, Built in self test (BIST) mode signal 218 and a power mode signal 220 and comprises logic operable to provide signal 224 to AND gate 222 and signal 226 to the selection input of controllable selecting device 208. For example, selection control circuit 214 may provide a low signal to AND gate 222 to isolate the second output 206. When selection control circuit 208 provides a high signal to AND gate 222, the output of AND gate 222 will be the same as the second output 206. Selection control circuit 214 also determines whether to select the first input 210 of controllable selecting device 208, which may be employed either for scan mode and/or for isolating first output 204 of device 202, or to the select the second input 212 of controllable selecting device 208 which is the first output of device 202.

For example, if the scan mode 216 signal is asserted (e.g. at a first level), selection control circuit 214 may send a low signal to AND gate 222 (isolating second output 206, and a signal to controllable selecting device 208 that selects the input signal of device 202 to scan the input of device 202 (or bypasses the output of device 202). If the scan mode signal is not asserted (for example at a second level), the signals provided by selection control circuit 214 may depend on BIST mode signal 218 and/or power mode signal 220.

If the BIST mode signal 218 is asserted, selection control circuit 214 may send a high signal to AND gate 222 so that the output of the AND gate 222 is the equivalent to the output of second output 206 and a signal to controllable selecting device 208 that selects second input 202 coupled to first output 204 of device 202. If BIST mode signal 218 is not asserted, the signals provided by selection control circuit 214 may depend on scan mode signal 216 and/or power mode signal 220.

If the power mode signal indicates a normal power mode, selection control circuit 214 may send a low signal to AND gate 222 so that second output 206 of device 202 is isolated by AND gate 222, and a signal to controllable selecting device 208 that selects second input 202 coupled to first output 204 of device 202. If the power mode signal indicates a low power mode, selection control circuit 204 provides a low signal to AND gate 222 thus isolating second output of device 206 and provides a signal to controllable selecting device 208 to select input 210 which isolates the first output 204 of device 202.

Thus, from the foregoing, selection control logic 214 employs controllable selecting device for two purposes. First, in scan mode, to bypass first output 204 of device 202. Second, in low power mode, isolating first output 204 of device 202. In addition, selection control logic 214 can employ AND gate 222 to isolate second output 206 of device 202.

Figure 3:
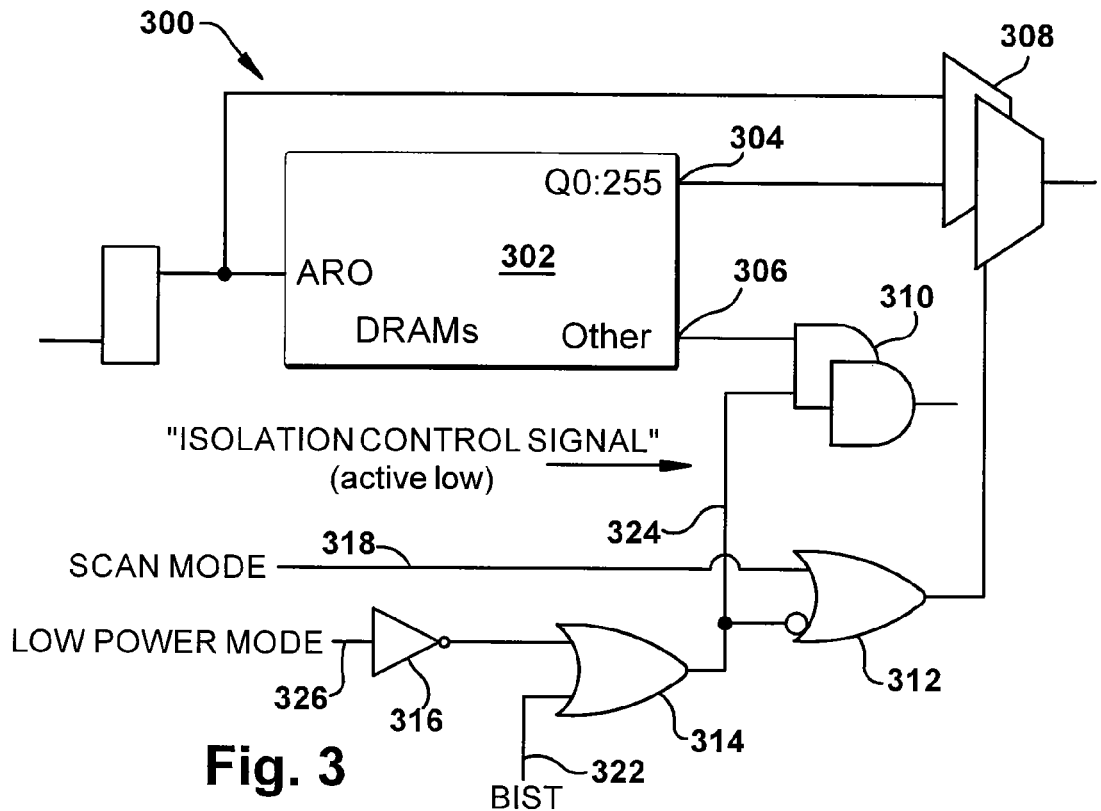
FIG. 3 illustrates an example of a circuit for implementing low power isolation for a eDRAM device having memory outputs and additional outputs.

FIG. 3 illustrates an example of a circuit 300 for implementing low power isolation for a eDRAM device 302 having memory outputs 304 and additional outputs 306. In this example, device 302 has 256 memory outputs (Q0:Q255) 304 and eighteen "Other" additional outputs 306. The "Other" outputs 306 may include but are not limited to test outputs (such as Direct Test outputs which may require isolation in low power mode and Fuse Interface outputs which may require isolation in low power mode as well).

The input of eDRAM 302 (ARO) is also coupled to the first input (labeled 1" in the drawing) of Scan Bypass Multiplexers (MUX) 308 and the memory outputs 304 are coupled to the second input (labeled "0" in the drawing) of Scan Bypass MUX 308. Outputs 306 of memory output are coupled to AND gate 310. In the illustrated example, memory device 302 comprises four eDRAM devices, each eDRAM device having two hundred fifty six memory outputs 304. Therefore, there are one thousand twenty four (×1024) MUXs 308 (one for each of the 256 memory outputs for each of the four eDRAMs, where one input of each MUX is coupled to one of the outputs of eDRAMs 302 and the second input is coupled to input ARO) and seventy two (×72) AND gates (one for each "Other" output of each of the four eDRAMs, where a first input of the AND gate is coupled to one of the "Other" outputs and a second input of the AND gate is coupled to the "ISO-LATION CONTROL SIGNAL" 324—the operation of which will be explained in more detail infra).

The operation of MUX 308 and AND gate 310 are based on signals received by OR gate 312 and/or OR gate 314. OR gate 312 receives a scan mode signal 318 on a first input. If scan mode signal 318 is low (digital zero or a first level) then the output of OR gate 312 depends on the second input. If the scan mode signal 318 is high (active), then the output of OR gate 312 is high and MUX 308 will select the first input (coupled to input ARO) of MUXs 308. The second input of OR gate 312 receives the isolation control signal 324 provided by the output OR gate 314. Isolation control signal 324 in this example is active low meaning that when the isolation control signal is low, the outputs 304, 306 of eDRAMs 302 are isolated. Because OR gate 312 receives the inverted isolation control signal 324, when isolation is active MUX 308 selects the first input coupled to input ARO of eDRAMs 302, thus isolating outputs 304 of eDRAMs 302. In this example configuration, MUX 308 functions as a Scan Bypass MUX but also as an Isolation Cell.

OR gate 314 receives the Lower Power Mode signal 318 after it has been inverted by inverter 316 on a first input, and BIST signal 322 on a second input. If low power signal 320 is asserted ("active" and BIST signal 322 is low), then the output of OR gate 314 (the isolation control signal 322) is low, causing AND gate 310 to function as an isolation cell for outputs 306, and since the inverted isolation control signal 322 is received by OR gate 312, MUX 308 selects the first input coupled to input ARO of eDRAMs 302, thus isolating outputs 304 of eDRAMs 302.

If BIST signal 322 is asserted (active), then the output of OR gate 314 is high (so isolation control signal 324 is inactive) so AND gates 310 do not isolate outputs 306 and MUX 308 selects the second input coupled to outputs 304. If BIST signal is low (inactive), then the output of OR gate 314 would depend on the state of Low Power Mode signal 318. In this example, BIST signal 322 can override low power signal 320; however, those skilled in the art should readily appreciate that BIST signal 322 can be masked off in low power mode if desired, although it would be unusual for BIST signal 322 to be active at the same time as low power mode signal 320.

As can be observe from the foregoing, by using Mux 308 as both a Scan Bypass Mux and as an isolation cell, additional isolation gates (for example AND gates coupled either between output 304 and Mux 308 or to the output of Mux 308) are unnecessary to isolate outputs 304 in low power mode. In this example, using Mux 308 as both a Scan Bypass Mux and an isolation cell would result in using one thousand twenty four (1024) fewer gates at a cost of adding (in this example) two additional gates, or a net savings of one thousand twenty two (1022) gates, which also eliminates an area penalty that would be incurred if additional isolation cells were inserted.

Figure 4:
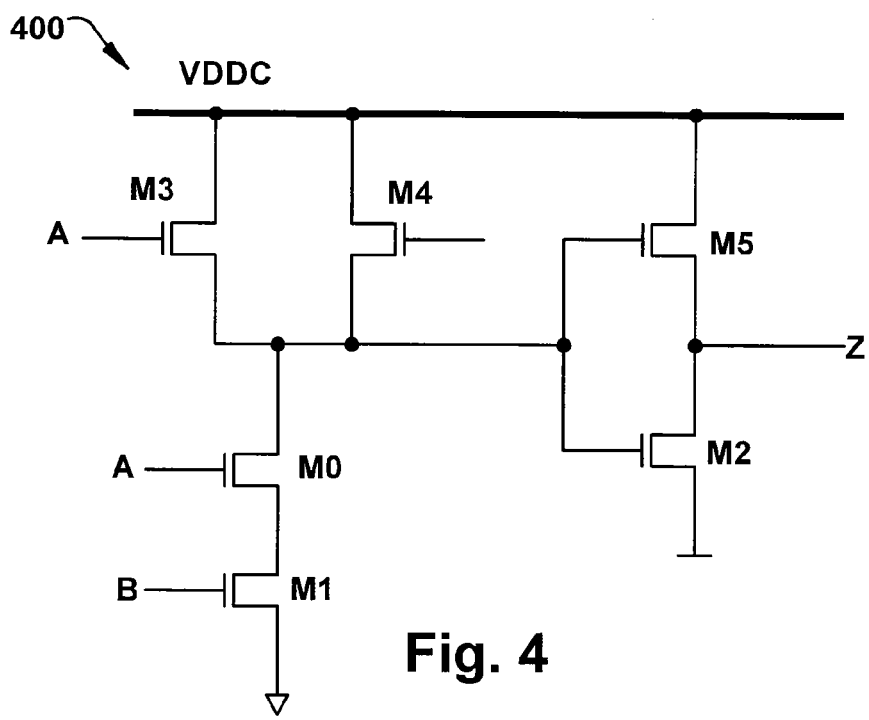
FIG. 4 illustrates an example of an AND gate suitable for performing isolation of the 'other' outputs of the circuit in FIG. 3.

FIG. 4 illustrates an example of an AND gate 400 suitable for performing isolation of the 'other' outputs of the circuit in FIG. 3. The gates of transistors M0 and M3 are coupled to PIN A (where M3 is PIN A inverted), which in this example is the powered off (isolated) outputs, for example outputs 306 of eDRAMs 302. The gates of transistors M1 and M4 are coupled to PIN B (where M4 is PIN B inverted). In this example, the isolation control signal is provided by PIN B, which is active low (like isolation control signal 322 in FIG. 3). The output of the first stage, comprising transistors M0, M1, M3, M4 is coupled to the gates of transistor M5 (inverted) and transistor M2. The output of the gate is represented by Z.

In operation, when PIN B is zero, transistor M1 cuts off, thus the (inverted) input into transistor M5 is high and M2 is low, thus transistor M2 cuts off so the output Z is low. So Z=0 when B=0, and Z is independent of state of A when B=0. Moreover, because transistors M2 and M1 are not conducting, there is no path from the powered off outputs to the inputs.

Figure 5:
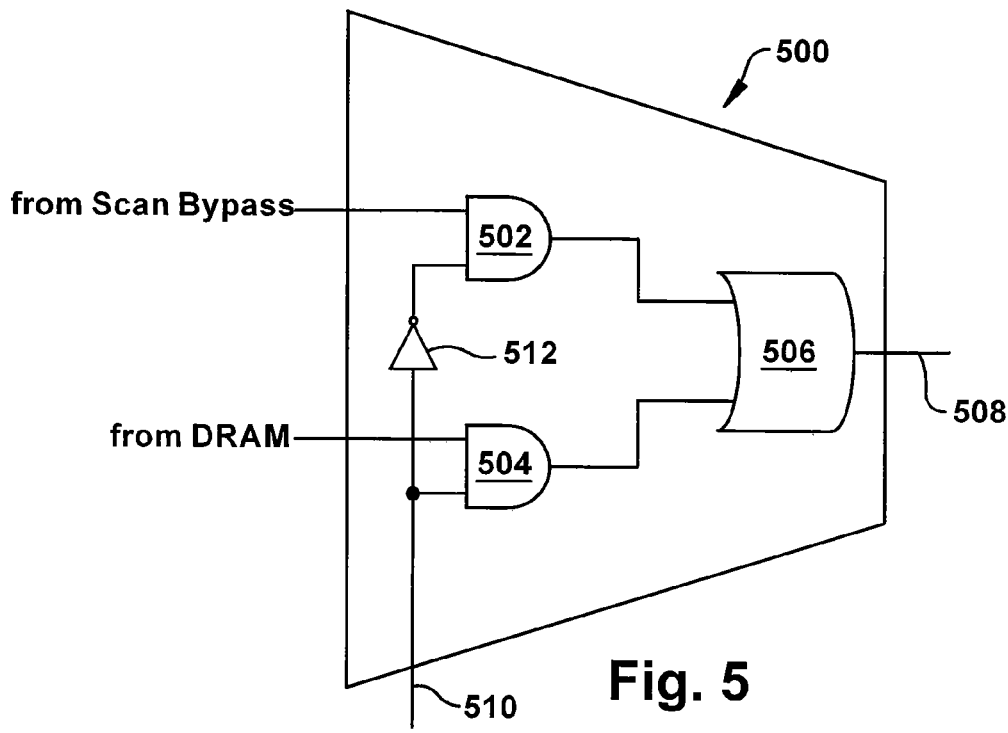
FIG. 5 illustrates an example of a multiplexer suitable for implementing low power isolation.

FIG. 5 illustrates an example of a multiplexer (Mux) 500 suitable for implementing low power isolation. Mux 500 comprises first and second AND gates 502 and 504 respectively whose outputs are coupled to OR gate 506 which provides the output 508 of Mux 500. One input of AND gate 502 is coupled to the SCAN Bypass line (for example the input of device 102 in FIG. 1 or ARO in FIG. 3) and one input of AND gate 504 is coupled to the output of the device (for example output of device 102 in FIG. 1 or one of the Q outputs of eDRAM 302 in FIG. 3). Select line 510 is directly coupled to the second output of AND gate 504 and is inverted by inverter 512 to the second input of AND gate 502. In this configuration, only one of AND gates 502 and 504 will be selected at any given time. For example, when select 510 is high, the output of AND gate 504 will be the output from the device. If select 510 is low, then AND gate 504 isolates the output from the device and the output of AND gate 502 will be the SCAN bypass and the output of the device.

Figure 6:
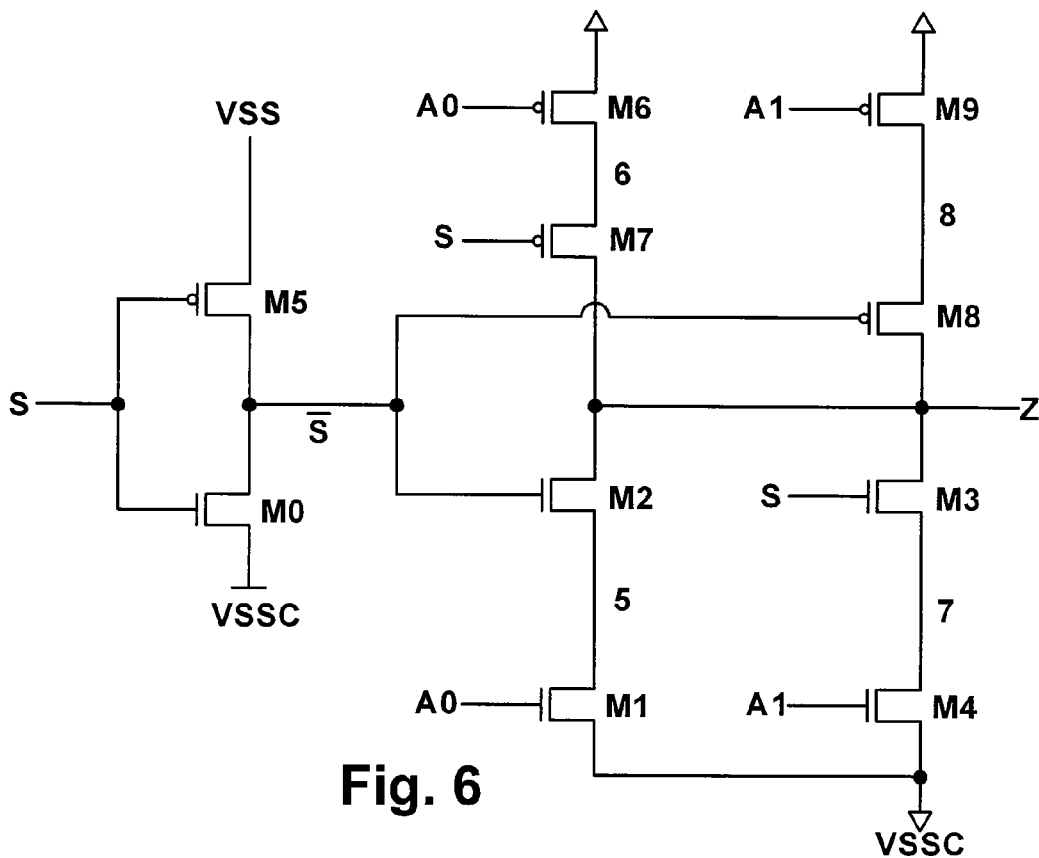
FIG. 6 illustrates an example of an inverted multiplexer suitable for implementing low power isolation.

FIG. 6 illustrates an example of an inverted multiplexer 600 suitable for implementing low power isolation. Transistors M3, M4 receive the select line input and transistors M5, M7 receive the select line input inverted. Transistor M1 receives the first input (A0) and transistor M6 receives the A0 inverted. Transistor M4 receives the second (A1) input and transistor M9 receives A1 inverted. The gates of transistors M2 and M8 receive the output from the first stage of the circuit (an inverter formed by transistors M0, M5). In this example, S=1 in low power mode, in which case the output, Z, equals A1 inverted. There are not paths for powered off outputs (A0), thus A0 is properly isolated.

Figure 7:
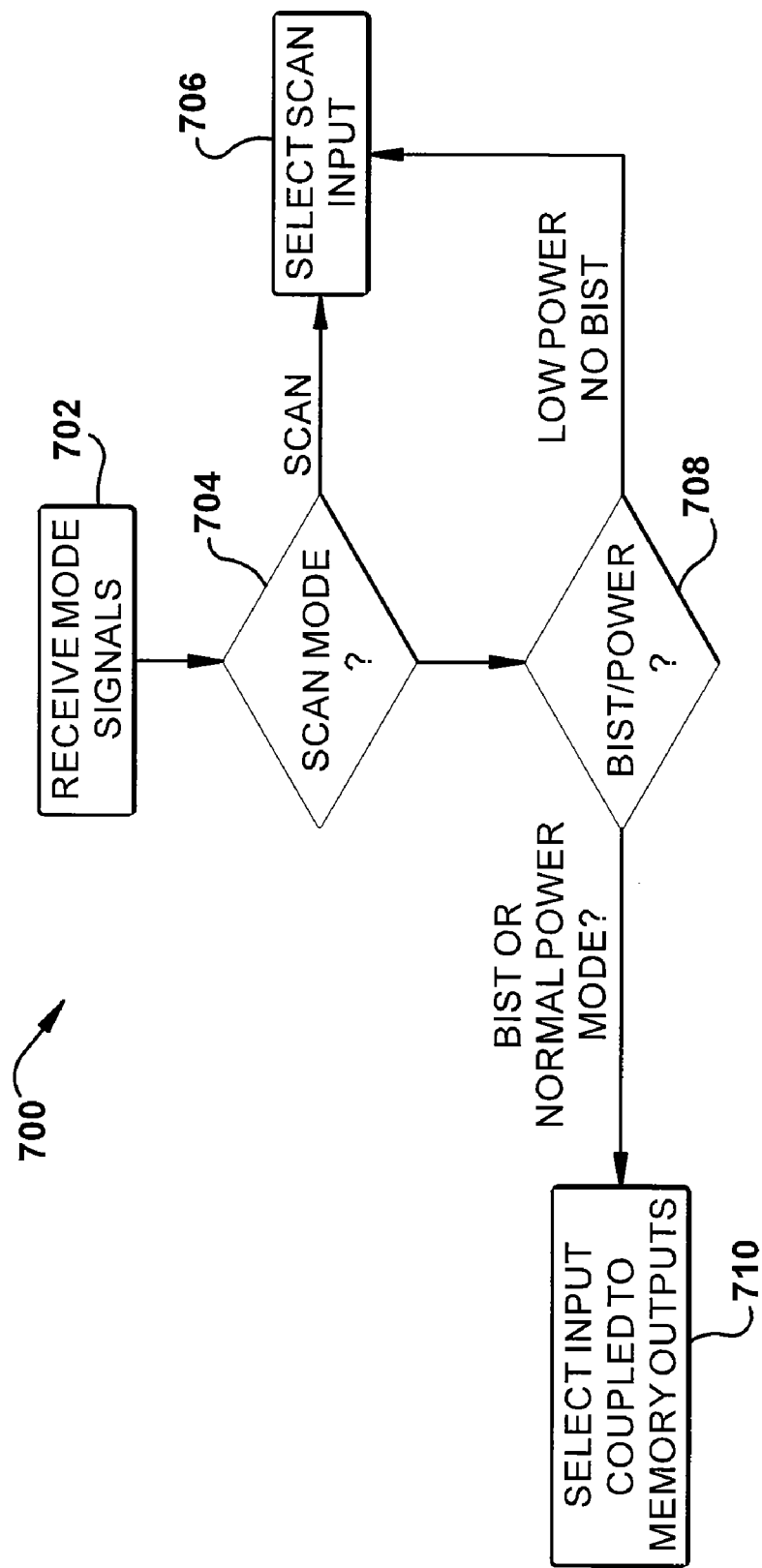
FIG. 7 illustrates an example of a methodology for implementing low power isolation.

In view of the foregoing structural and functional features described above, a methodology 700 in accordance with an example embodiment will be better appreciated with reference to FIG. 7. While, for purposes of simplicity of explanation, methodology 700 of FIG. 7 is shown and described as executing serially, it is to be understood and appreciated that the example embodiment is not limited by the illustrated order, as some aspects could occur in different orders and/or concurrently with other aspects from that shown and described herein. Moreover, not all illustrated features may be required to implement a methodology in accordance with an aspect the example embodiment. Methodology 700 described herein is suitably adapted to be implemented in hardware, software, or a combination thereof.

In this example, a device having an input and an output are coupled to a multiplexer. The first input of the multiplexer (also referred to as the Scan Bypass) receives the signal that is provided to the input of the device. In FIG. 3 for example, this would be ARO. The second input of the multiplexer receives the output of the device (for example in FIG. 3 the Mux would be receiving one of the Q outputs, e.g. one of Q0-Q255). When the Mux selects the first input, the Scan Bypass signal is output and the second output is isolated. An aspect of an example embedment is that the Mux selects the first input for multiple purposes such as when performing a Scan Bypass test, and also when in low power mode to isolate the outputs of the device. Methodology 700 is concerned with determining which input of the Mux to select.

At 702, signals indicating the current operating mode (mode signals) are received. For example the power mode signal may be received, where a first level of the power mode signal indicating a normal operating mode and a second level indicating a low power level. A built in self test mode (BIST) signal may be received, where a first level of the built in self test mode signal indicating a self test mode is active and a second level indicating the built in self test mode is inactive. A scan mode signal may be received, where a first level indicates a scan mode is active and a second level indicates the scan mode is inactive. In various example embodiments, only one of the aforementioned signals may be received, or any combination of the aforementioned signals may be received. For the purposes of this example, it will be assumed all three signals were received although those skilled in the art should readily appreciate that this example can be easily modified to implement a method that employs less than all three signals.

At 704, the level of the scan mode signal is determined. if the scan mode signal is received at the first level (SCAN), then the first (Scan) input of the Mux is selected as indicated at 706. If the scan mode signal is determined to be at the second level, the BIST and power mode signals are analyzed to determine which input to select.

At 708, the determination is made whether the power mode signal is at the first or second level and whether the built in self test (BIST) mode signal is at the first or second level. If the power mode signal is at the second level (indicating low power mode) and the BIST signal is at the second level (indicating no BIST testing or BIST inactive), the first (SCAN) input is selected as indicated by 706. Otherwise, (either the power mode signal is at the first level indicating normal operating mode or the BIST signal is at the first level indicating BIST mode—or BIST is active) the second input that is coupled to the memory outputs is selected as indicated by 710.

Described above are example embodiments. It is, of course, not possible to describe every conceivable combination of components or methodologies, but one of ordinary skill in the art will recognize that many further combinations and permutations of the example embodiments are possible. Accordingly, this application is intended to embrace all such alterations, modifications and variations that fall within the spirit and scope of the appended claims interpreted in accordance with the breadth to which they are fairly, legally and equitably entitled.

The invention claimed is:

1. An apparatus, comprising:
a device having an input and an output;
a controllable selecting device having a first input coupled to input of the device and a second input coupled to the output of the device;
a selection control circuit having a test input for receiving a test signal having a first level for indicating testing is being performed and a second level for indicating testing is not being performed, and a power mode input for receiving a power mode signal having a first level indicating normal power mode and a second level for indicating a lower power mode, wherein the selection control circuit is coupled to the controllable selecting device and operable to control which input the controllable selecting device selects;
wherein the selection control circuit is configured to select the first input to isolate the output of the device responsive to the test signal being at the second level and the power mode signal being at the second level.

2. The apparatus set forth in claim 1, wherein the device is a memory device having a memory output and at least one other output requiring isolation in low power mode, further comprising an AND gate having a first input coupled to the at least one other output and a second input coupled to the selection control circuit;
wherein the selection control signal sends a low signal to the AND gate which isolates the at least one other output responsive to the power mode signal received by the selection control circuit being at the second level.

3. The apparatus set forth in claim 2, wherein the test input further comprises a first test input for receiving a scan mode signal, the scan mode signal having a first level to indicate scan mode is active and a second level to indicate scan mode is inactive, and a second test input for receiving a built in self test mode signal having a first level to indicate built in self test mode is active and a second level to indicate built in self test mode is inactive; and
wherein the selection control circuit is configured to select the first input of the controllable selecting device responsive to the scan mode signal being at the first level.

4. The apparatus set forth in claim 3, wherein the selection control circuit is configured to select the second input of the controllable selecting device responsive to the built in self test mode signal being at the first level.

5. The apparatus set forth in claim 4, wherein the selection control circuit is configured to employ the AND to isolate the at least one other output responsive to the built in test mode signal being at the second level.

6. The apparatus set forth in claim 3, wherein the selection control circuit is configured to employ the AND gate to isolate the at least one other output responsive to the power mode signal being at the second level and the second test input built in test mode sign being at the second level.

7. The apparatus set forth in claim 3, wherein the controllable selecting device is a multiplexer.

8. The apparatus set forth in claim 7, wherein the multiplexer comprises:
a first AND gate having first and second inputs and an output;
a second AND gate having first and second inputs and an output;
an OR gate having an output and first and second inputs coupled to the outputs of the first and second AND gates respectively;
wherein the first input of the first AND gate is coupled to the input of the memory;
wherein the first input of the second AND gate is coupled to the output of the memory; and
wherein the second input of the first AND gate is coupled to the selection control circuit and the second input of the second AND gate receives an inverted signal received by the second input of the first AND gate.

9. The apparatus set forth in claim 7, wherein the multiplexer is an inverted multiplexer.

10. The apparatus set forth in claim 7, wherein the multiplexer further comprises a select input for selecting the first or second input, further comprising:
an OR gate having first and second inputs and an output coupled to the select input of the multiplexer;
wherein the first input of the OR gate is receives the scan mode signal and the second input receives the signal sent to the AND gate inverted.

11. The apparatus set forth in claim 10, further comprising a second OR gate having first and second inputs and an output, the first input receiving the power mode signal inverted, the second input receiving the built in test signal, and the output coupled to the AND gate and to the second input of the first OR gate.

12. The apparatus set forth in claim 11, wherein the memory device further comprises a plurality of memory outputs, each of the plurality of memory outputs is coupled to a multiplexer having first and second inputs and a select input, wherein the first input is coupled to the input of the memory and the second input is coupled to a one of the plurality of memory outputs and the select input is coupled of the output of the first OR gate.

13. The apparatus set forth in claim 12, wherein the memory device further comprises a plurality of other outputs, each of the plurality of other outputs is coupled to an AND gate having first and second inputs, wherein the first input is coupled to a one of the plurality of other outputs of the second input is coupled to the second OR gate.

14. The apparatus set forth in claim 13, wherein the other outputs include at least one test output.

15. The apparatus set forth in claim 14, wherein the memory device further comprises a plurality of memory devices, each having an input and a plurality of memory outputs, wherein each of the plurality of outputs are coupled to a multiplexer having first and second inputs and a select input, wherein the first input of the multiplexer is coupled to the input of the memory and the second input of the multiplexer is coupled to one of the plurality of outputs of the memory device and the select input is coupled to the output of the first OR gate.

16. The apparatus set forth in claim 2, wherein the selection control signal sends a low signal to the AND gate which isolates the at least one other output responsive to test signal being at the second level and the power mode signal being at the second level.

17. An apparatus, comprising:
   a device having an input and an output;
   a multiplexer having a first input coupled to input of the device and a second input coupled to the output of the device;
   means for selecting one of the first input of the multiplexer and the second input of the multiplexer, the means for selecting having first input for receiving a scan mode signal having a first level indicating a scan mode is active and a second level indicating the scan mode is inactive, a second input for receiving a built in self test signal having a first level indicating built in self test mode and a second level indicating the built in self test mode is inactive, and a third input for receiving a power mode signal having a first level indicating normal power mode and a second level for indicating a lower power mode, wherein the means for selecting is coupled to the multiplexer and operable to control which input the multiplexer selects;
   wherein the means for selecting is configured to select the first input to isolate the device responsive to the scan mode signal being at the second level, the built in self test signal being at the second level and the power mode signal being at the second level.

18. The apparatus set forth in claim 17, wherein the means for selecting is further configured to select the second input responsive to one of a group consisting of the scan mode signal being at the first level, the built in self signal being at the first level and the power mode signal being at the first level.

19. The apparatus set forth in claim 17, wherein the device is a memory device having a first output that is coupled to the second input of the multiplexer and a test output coupled to an AND gate;
   wherein the means for selecting is coupled to the AND gate is responsive to send a low signal to the AND gate to isolate the test output.

20. A method for isolating an output of a device also having an input, where the input of the device is coupled to a first input of a multiplexer and the output of the device is coupled to a second input of the multiplexer, comprising:
   receiving a power mode signal, where a first level of the power mode signal indicating a normal operating mode and a second level indicating a low power level;
   receiving a built in self test mode signal, where a first level of the built in self test mode signal indicating a self test mode is active and a second level indicating the built in self test mode is inactive;
   receiving a scan mode signal where a first level indicates a scan mode is active and a second level indicates the scan mode is inactive;
   determining whether the power mode signal is at the first or second level;
   determining whether the built in self test mode signal is at the first or second level;
   determining whether the scan mode signal is at the first or second level; and
   selecting the first input of the multiplexer to isolate the output of the device responsive to determining the power mode signal is at the second level, the built in self test mode signal is at the second level and the scan mode signal is at the second level.

* * * * *